United States Patent [19]

Poelstra

[11] Patent Number: 4,994,971
[45] Date of Patent: Feb. 19, 1991

[54] SYSTEM FOR SETTING UP AND KEEPING UP-TO-DATE DATAFILES FOR ROAD TRAFFIC

[76] Inventor: Theo J. Poelstra, Klokkengietershoeve 104, 7326 SC Apeldoorn, Netherlands

[21] Appl. No.: 295,176

[22] Filed: Jan. 6, 1989

Related U.S. Application Data

[63] Continuation-in-part of Ser. No. 112,569, filed as PCT EP86/00731 on Dec. 2, 1986, published as W087/03718 on Jun. 18, 1987, abandoned.

[30] Foreign Application Priority Data

Dec. 6, 1985 [NL] Netherlands .......................... 8503378
Dec. 23, 1985 [EP] European Pat. Off. ......... 85202132.8
Dec. 2, 1986 [WP] PCT Int'l Appl. ... PCT/EP86/00731

[51] Int. Cl.$^5$ .............................................. G01B 11/30
[52] U.S. Cl. ........................... 364/424.04; 364/424.01; 364/550; 73/146
[58] Field of Search ....................... 364/424.01, 424.05, 364/436, 443, 449, 460, 424.04, 550; 358/103, 108; 360/5; 73/146

[56] References Cited

U.S. PATENT DOCUMENTS

| | | | |
|---|---|---|---|
| 4,281,354 | 7/1981 | Conte | 360/5 |
| 4,360,876 | 11/1982 | Girault et al. | 364/449 |
| 4,396,942 | 8/1983 | Gates | 358/107 |
| 4,495,500 | 1/1985 | Vickers | 364/449 X |
| 4,543,603 | 9/1935 | Laurés | 358/108 X |
| 4,586,138 | 4/1986 | Mallenhoff et al. | 364/424.01 |
| 4,635,136 | 1/1987 | Ciampa et al. | 360/14.1 X |
| 4,653,316 | 3/1987 | Fukuhara | 73/146 |
| 4,689,748 | 8/1987 | Hoffman | 364/424 X |
| 4,843,463 | 6/1989 | Michetti | 360/5 |
| 4,899,296 | 2/1990 | Khattak | 364/550 |

Primary Examiner—Thomas G. Black
Attorney, Agent, or Firm—Flynn, Thiel, Boutell & Tanis

[57] ABSTRACT

A road inventory system includes a mobile unit and a stationary unit. The mobile unit includes a vehicle which has a metric database for delivering information relating to an area to be surveyed, a plurality of video cameras taking pictures of respective parts of the area on a first recording medium with associated address signals, and a data recording apparatus which records on a second recording medium relevant data from the database together with vehicle motion information, the data recording apparatus producing the address signals. The stationary unit includes a video display for reproducing on several screens the video information on the first recording medium, a data reproducing apparatus for reproducing the data recorded on the second recording medium and storing it in a data inventory system, and a data processing arrangement for combining and recording on a third recording medium a selection of the video and data information from the first and second recording mediums.

4 Claims, 7 Drawing Sheets

SYSTEM FOR SETTING UP AND KEEPING UP-TO-DATE DATAFILES FOR ROAD TRAFFIC

CROSS REFERENCE TO RELATED APPLICATION

This application is a continuation-in-part of application Ser. No. 07/112 569, now abandoned, filed Aug. 5, 1987.

BACKGROUND OF THE INVENTION

1. Field of the Invention

In the world of traffic and transport an ever increasing number of electronic devices are being put into use; in particular there is a marked increase of computer applications, also on-board of vehicles. It is obvious that on-board computers should be perfected so that they can also be used for determining:
 routes and distances;
 generation of site information;
 the use of these data for the purpose of navigation;
 the processing of (coded) up-to-date route information via a radio receiver. The procedure to describe here concentrates on the technique of the initial collection of the data necessary for navigation.

To make navigation via the on-board computer possible, two conditions are to be met in principle:

(a) the availability of an electronic map, as it were the framework within or across which one moves, and (b) the updating of the location of the vehicle within the limits referred to in (a).

The procedure to be described constitutes a means to solve the problem of the production and updating of data files for an electronic map as mentioned in (a) in the most efficient way.

The required data files which will be made for the purpose of navigation of the motorized road traffic now consist of two groups of data:

(1) metrical data: the system of co-ordinates;

(2) non-metrical data which are added to the metrical data. There are a great many non-metrical data, for the greater part referring to matters of traffic technique and other traffic and object information. These very large files can be made accessible to the user via CD-ROM only. Solving the problem of compiling and updating those files in a very efficient way depends, on the one hand, on the application of a perfectly equipped production process and, on the other hand, on a ready support of that production process by supplying it with up-to-date information, both to enable the file (=map) to be as complete and up-to-date as possible, and to largely reduce expensive additional investigation in the field. The procedure to be described is aimed at the last mentioned aspects.

This invention relates to a road inventory system for gathering visual data from which road data files can be generated, in order to compile and to update a road data base. This road inventory system consists of three main parts:
 a mobile unit, for video registration and measuring;
 a stationary unit for editing and post processing;
 a customer set, a desk-top user display and retrieval system.

2. Description of the Prior art

U.S. Pat. No. 4,396,942 discloses a method for video surveying, comprising the steps of: video recording all locations to be surveyed from a predetermined control position, for subsequent playback on a monitor screen. The method uses an overlay to the monitor screen or actual measurement in the terrain to ascertain actual distances, and allow for adding notes to the video recordings. The video survey may be conducted from a moving vehicle, using a video cassette recording apparatus.

U.S. Pat. No. 4,635,136 discloses a method and apparatus for storing a massive inventory of labeled images. The inventory is produced on different frames of a video disc, from which the images may be randomly accessed for use in tax assessment, real estate sales and the like. Digital information is accessed from memory associated with a computer and monitored to define a route for a field rig, equipped with a video camera, which scans the images and provides TV signals in the order in which the digital information corresponding to the image to produce TV signals with labeling information therein. Pluralities of frames of the TV signals are recorded on a video recorder. A single frame is selected from each plurality and recorded on a different frame of the video disc record.

U.S. Pat. No. 4,495,500 discloses a system for gathering topographic data for use in computer generation of topographic maps of various forms. This system includes equipment mounted in an aircraft which can be flown over a terrain area which is to be surveyed. The equipment comprises a low frequency radar which is capable of penetrating foliage in the survey area for generating a signal representative of the distance from the aircraft to the terrain surface. Also a precision altimeter, temperature and humidity sensors, a clock and a digital recorder are included. The recording medium can be removed from the aircraft. Concurrent with the gathering of data in the aircraft, temperature and humidity data and at surface of the earth are gathered and recorded. Combination of the recordings can be used as computer input to produce accurate topographic maps.

U.S. Pat. No. 4,360,876 discloses an indicator system which satisfies multiple flight-mission requirements by providing an aircraft pilot with a visual display consisting of a movable map and navigational data. The map is stored in video form in a high-capacity compact mass memory consisting of a video disk. The system further comprises a symbol and character generator, intermediate memory and a TV monitor. The unit is controlled by a micro processor on the basis of data relating to latitude, longitude and heading of the aircraft.

U.S. Pat. No. 4,689,748 discloses a device for use on aircraft or spacecraft providing data corresponding to the course and orientation of the craft, and a digital display of the terrain over which the craft is travelling. It is a digital image scanning device, making use of the principle of aerial triangulation by tying in sequential images. The device, in combination with a computer, produces information in digital form and with unequivocal co-ordinate determination. F.i. distortion-free representation or read-out of the terrain can be produced.

U.S. Pat. No. 4,543,603 discloses a reconnaissance system comprising an air-borne vehicle capable of moving above a territory to be surveyed by rotating about its longitudinal axis, and means for taking images disposed on board the vehicle to observe said territory by a helicoidal scanning in relation with the rotation of the vehicle, wherein the vehicle is of the self-propelled missile type and the sensitive members are formed by at least one linear assembly of photosensitive elements disposed parallel to the longitudinal axis of the missile to give at each line an image of an elementary strip of territory which scans a strip of territory upon each revolution of the missile, the total image of the territory being formed by the plurality of images of the successive strips.

DE Pat. No. 3,235,993 discloses a system for electronic recording of commercial available maps on audio tape for instance in order to use these tapes in cars or other places, by reproducing (parts of) these maps on a monitor.

SUMMARY OF THE INVENTION

As indicated before there is a demand in the road traffic for data about routes and traffic situations along those routes. The topographic data are obtained by digitizing maps and keeping them in a metric file. One wants to link a file of additional data to these topographic data, in which information on traffic situations, public transport, filling-stations, etc. can be found. The situation data is to be gathered by making recordings with the mobile system of the road network in a certain area.

Therefore, according to this invention, recordings will be made with video cameras, and these recordings will be registered by a video recorder. Besides, also according to this invention, additional data will be recorded such as road travelled, inclination, etc. For directing the recording equipment, the registration of the additional data and the navigation in the car a computer system is present.

The recordings which have been made by car are elaborated further on other systems. The sensor-data and the linking of the video recordings with the location (location-indication) are kept in a file. Working from this video-tape file later view-sets for a specific purpose can be made according to the clients' specifications.

For the recording of traffic data the production company has a vast central computer system available. Linked to the central processing unit of this computer at the production company itself, are a number of graphic working-stations which can be used by computer-operators for the input of the road information in a data base in this central computer.

For obtaining the metric data we start from all kinds of topographic material. By way of a digitizer linked to a working-station all roads in a certain area are digitized and recorded in the data-base on the central computer one at a time. This data base consists of two parts:

a metric file which contains all topographic information necessary for generating a graphic representation on the working-stations;

an alpha-numeric file which contains all additional data such as busstops, tramstops, tunnels, traffic indications, geographic locations, commercial locations, etc. From the metric file references are made to additional data in the alpha-numeric file.

A part-area of a map (scale 1:10,000) is digitized and together with some standard-data, recorded in a file. The road-information in the metric-file is arranged in so-called 'chains'. A chain is a road with constant characteristics, this for instance means that a chain is a road without by-roads but also that the entire road has the same type of road surface.

Because of the following reasons a road can be divided into various chains:
on the border of a map-page;
on the border of a municipality;
on the crossing to another road;
on account of characteristics such as road-width, type of road, etc.

A chain can be represented as a number of points placed after each other linked by way of lines. During the digitizing of a map the work-preparer decides which points on the map will form a chain. Internally in the metric file, a chain is recorded as a series of map co-ordinates. The points at the end are called nodal points: the points in between are called intermediate points. The information consisting to a chain is recorded in the geographic file as so-called line-strings.

Each line-string consists of a collection of co-ordinates and at the end a number that refers to a chain of data belonging to it in the alpha numeric file, the chain number.

A purpose of the invention is the provision of a method and the apparatus to obtain just that additional information that is needed in the alpha-numeric file. Here, we can think of:
traffic signs;
pedestrian crossings;
traffic lights;
bus- and tramstops;
road width;
number of carriageways;
type of roadsurface;
tramrails;
filter instructions;
(level) crossings;
direction posts;
distance signs;
tunnels;
road markings;
viaducts;
height clearance measures;
bridges, ferries, tolls;
route directions;
border crossings;
geographic locations;
commercial locations;
special locations.

This additional information is obtained via the image-recording equipment and sensors of the mobile part of the road inventory system. Thus the characteristics mentioned above can be concluded and, together with the sensor data they can be added to the alpha-numeric file.

Another purpose for the invention is the supply of the method and the apparatus to make series of images of streets in a certain area for third parties, such as the police, the fire-department, ambulances, public transport, etc.

The method in the road inventory system according to the invention has four phases.

The preparation.

Here it is determined in which area a survey has to be executed. On the central system therefore a metric part-data base is made for use in the mobile system.

The survey itself.

This itself consists of a preparation, the survey and the sending of the results.

The processing of the results.

The videotapes are viewed by the work-preparer and specialties are read out. By use of the read-out data plus the additional sensor data from the car the alpha-numeric file on the central computer is built up or brought up-to-date.

The exploitation of the results.

The tapes are kept as mastertapes. These mastertapes are used further for producing a view-set following client-specifications. This concerns copying from the mastertapes the series of images to be specified by the client. To this an index is added, by the use of which for instance images can be found by street-name.

The expedients according to the invention consists of three groups.

The mobile system.

This consists of a vehicle on which there are four recording cameras: two in the driving direction and two on a 90 degree angle to them. During the driving the cameras registrate continually, while the images of all four cameras are recorded by only one recorder. To this a special multiplex system is developed. Further there are sensors for distance, driving-direction, clearance, inclination and strength of light.

The car consists of three parts: a driver compartment, a navigator part and a generator and battery part. In the navigator part we can find the video-registration equipment, computer and data-collecting equipment.

A stationary system.

This consists of a special de-multiplexer, viewing monitors and a computer system, in order to be able to watch the images of the individual cameras separately, for the purpose of inventory.

A customer set.

With the use of this clients may watch the tapes made after their specification.

BRIEF DESCRIPTION OF THE DRAWINGS

For the purpose of illustrating the invention, in the drawings forms are shown which are presently preferred; it should be understood, however, that this invention is not limited to the precise arrangements and instrumentalities shown.

DESCRIPTION OF THE PREFERRED EMBODIMENT

The preparation

Figure 1:
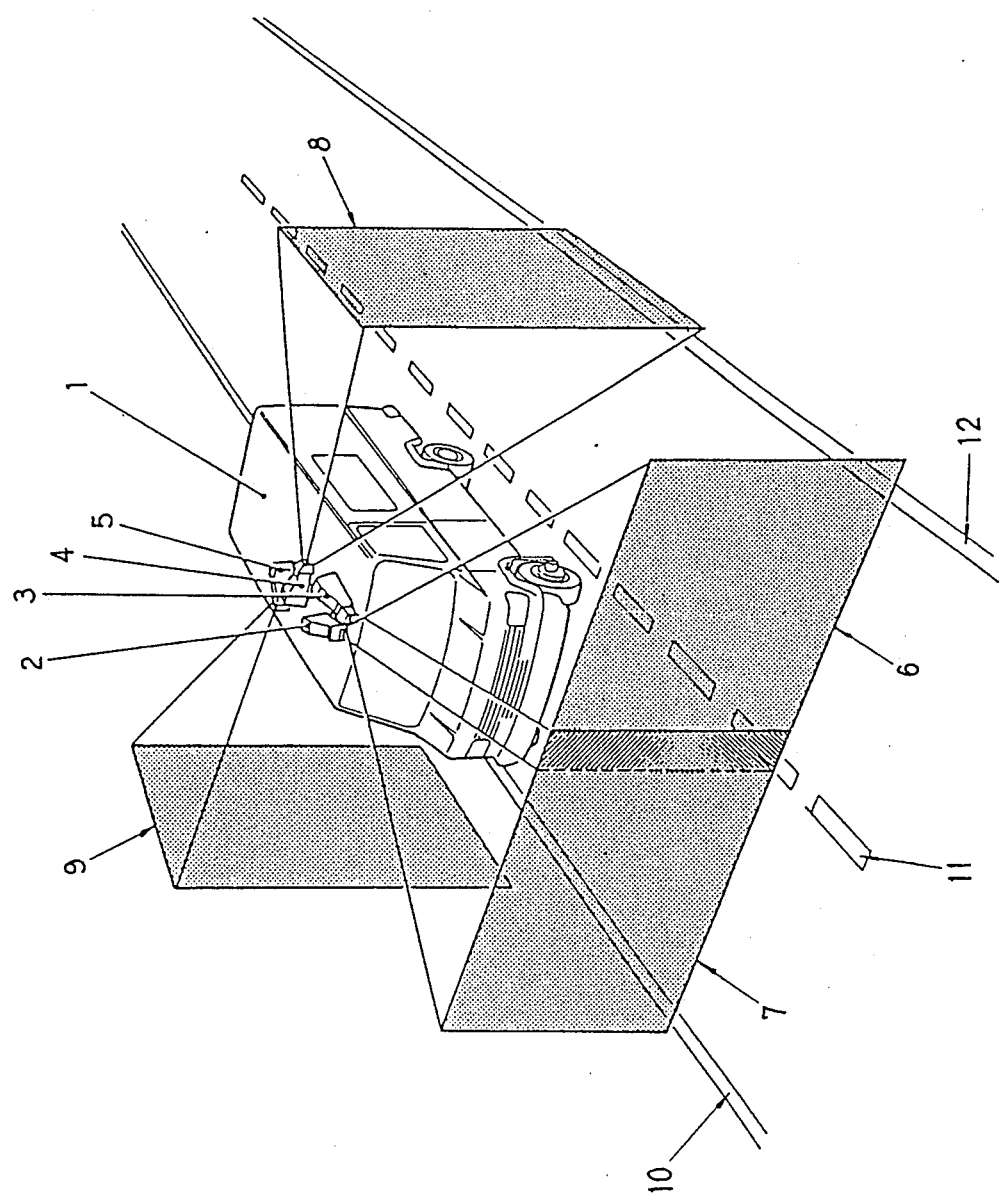
FIG. 1 is a perspective view showing the mobile part of the road inventory system, and particularly the four cameras and their fields of view in accordance with this invention.

Referring more particularly to the drawings, reference numeral 1, indicates the mobile system during a recording on a two lane motorway, of which—among other things—the sides 10 and 12 and the middle 11 are recorded.

Centrally an area is chosen, in which a survey has to be executed. For the area to-be-surveyed a metric part-data base is made on the mother-system for use in the video car. The specific part of the metric data base is locked, so that during the survey chain numbers will not be changed. This is necessary since chain numbers are linked to the video images.

From the metric part-data base a simple plot is made, with the use of which the personnel in the car, 1 (see FIG. 2), can roughly plot the routes to be driven. The metric part-data bases are supplied to the video car personnel on floppy disc or cartridge tape.

The crew also receives a number of empty videotapes and topographic data of the area. The metric partdata base is read in, via the FD drive 29 in the central computer 30 and converted to a shape which is easy to present. The data which are read in are checked by way of the plot that was supplied.

The navigator plans a day-schedule, that consists of the areas that, according to him, will be covered. Besides that he is able to, during the drive, put an ad hoc route into the on-board computer 30, consisting of a number of chains, which are linked as much as possible, that may be covered in a row. The purpose of this is that it is prevented as well as possible that the navigator will have to make too many decisions in a short time.

The working of the entire system, calibration of the sensors 16, 17, 32 and 35 included, is tested according to an automatic procedure.

Administrative data, such as date, time, calibration of the sensors, crew, carnumber and numbers of floppy disc and videotape can be put in.

The video car is driven to the starting-point. The part of the metric data base, that will be driven, is put on the screen 18 and the starting-point and the chain with which will be started are shown on the screen 18 by the navigator.

Before starting an actual registration, the crew of the survey car (i.e. navigator, driver) will have to deliberate about the route to-be-followed. Here the on-board computer 30 renders assistance by way of a graphic presentation 18 of all roads of the area in which the survey car is present. In this presentation the roads that have been surveyed are indicated differently from the roads that have not yet been driven. The navigator has to tell the on-board computer 30 which roads they intend to drive subsequently (planned route).

The driving

So the recordings are made with the video car 1 (see FIG. 1), which is equipped with video cameras 2-5, a video recorder, a computer system and sensors. This as a whole is called the video car, and recorded are the view-fields 6 and 7 (forward) and 8 and 9 (sideways).

The part-areas, which are surveyed, are planned by day, making use of routeplan maps. The precise route is chosen during the drive (ad-hoce routeplans). The on-board computer 30 (see FIG. 2) provides the options for planning one ore more routes through a part-area.

Navigating is entirely done with the use of the metric part data base, position-finding equipment is not present in the car. However, the on-board computer does support navigating by presentation of the metric part-data base and the position of the roads and the direction in which is driven.

The crew consists of a driver who only has the task to direct the video car at the indication of the navigator, who is concerned with navigation, registration (sensor data and video-images) and guarding the quality of the registrations. It is of grave importance to use a good strategy at the navigation to make sure that double recordings are made as few as possible, that the average speed is as high as possible and that the images are of optimum quality. As far as the last-mentioned is concerned, the position of the sun, presence of traffic and parked cars (visibility of objects), will have to be taken into account.

The area that is covered has a volume of an average four hours of effective recording per day. Outside the built-up area on motorways an average speed of 65 km. p.h. may be reached and on the other roads 40 km. p.h. Inside the built-up area an average speed of only 20 km. p.h. is calculated. At an average speed of 30 km. p.h. a maximum of 1,500 chains are done per hour.

The chosen area is surveyed by driving a number of routes through the area. From the work-preparation it should be possible to indicate that some chains will have to be driven in both directions. Each time a route is chosen and a driving-strategy agreed upon (for instance if the agreed route is left, then keep the direction north-south as much as possible) by the navigator, in deliberation with the driver. This strategy is determined by the position of the sun, the traffic-situation and the roads that still have to be done.

The routes are driven per chain. The navigator indicates to the driver where he has to drive. At driving a chain he has to:

indicate which road (chain) has to be driven subsequently;

indicate the moment on which the nodal point at the end of a chain is passed, with button 14.

Besides this the navigator will have to watch which video-images are being recorded, via monitors 36–39. The navigator will (in the future) make panoramic recordings of difficult points.

Correction of the route: it may become clear that the planned route cannot be followed, because a chain cannot be driven in the planned direction or is closed temporarily or permanently for car-traffic. The navigator than indicates, manually, another chain, via keyboard 21.

When the navigator discovers that the route, indicated by him does not correspond with the route driven in reality, he may correct the identifications or he may remove the chain registrations, via 21.

After a route, with possible deviations, has been driven, it is validated by checking if the on-board computer 30 reported possible navigation mistakes and if the point where the video car is, is in agreement with the presented position in relation to the metric data base. The navigator may then apply corrections in order to co-ordinate the registered route and the actually driven route. Then he can also indicate inconsistencies with the metric part-data base.

Finally the navigator takes care of the changing of the videotapes, on recorder 44, or the spare recorder 45.

During the driving the navigator has to indicate that the car has come to the end of a road by pressing a functionkey 14. The board-system will then assume that the car continues its route via the first road in the planned route. However, at any time the navigator may deviate from this planned route. In that case it has to be indicated at every new road which is the first road to-be-driven. In the event that a subsequent road has not been indicated, the system itself will select a road on the basis of the sensor-information that is available at that moment (distance, 16 and 17, direction 35). The navigator then has the option to change this road as long as no end is indicated.

For the purpose of navigation the progress of the car is presented by the board-system in two ways in the graphic presentation of the metric data base, by way of the available distance and direction sensor data.

The road which has been covered is presented in a stressed way (coloured and/or highlighted) on the screen 18. Thus one sees the route growing at the speed in which the car completes the planned route.

On the screen an arrow is shown which indicates the measured distance and the direction in relation to the starting-point of the current road.

Using the arrow the navigator is able to verify whether the road which is being driven at the moment still agrees with the road indicated by the board-system. At a possible correction the presentation of the road covered on the screen will "jump" to another road.

Thus, driving along, the system collects a linked, by way of a time code generator in 44, amount of video and metric sensor data for every road which has been covered. The former recorded on a video recorder in 44, the latter in a provisional data base that is segmented according to the roads that have been driven according to the board-system. At regular intervals the crew will stop (for a short time) both the car and the survey in order to validate the thus accumulated data and (thus) add them to the image data file. They are recorded on hard-discs 27 and 28 later on floppy-disc 29. The indication "route already surveyed" will then be adjusted in accordance with these data.

The length of this, regularly re-occurring, halt, will somewhat depend on circumstances such as navigation problems and experience of the navigator with solving them. Normally speaking this will only take a few minutes.

Before deciding to accept (validate) the navigator, using all the means he has at his disposal (i.e. observation, computer presentation, maps, etc.), will have to judge two cases:

Are the accumulated data of sufficient quality?

Is the indicated route in accordance with reality?

In the case of route inconsistencies the navigator has the opportunity to, under certain conditions, apply modifications on the road which is indicated by the board system 30.

Among other things it is possible that in actual fact another route was driven then was originally planned without noticing this on time (i.e. on the first road that deviated). This has as a result that the sensor information, which was recorded in the provisional file per road, is labelled with the wrong road-identifications.

The navigator crew may from the (nodal) point on which the navigation is trusted entirely, change all subsequent road segments from the (provisional) file to the (according to him/her) actual route driven or remove them partly or entirely. All this under the restriction that the part which is to be validated always has to contain a collection of roads that is connected.

If roads are removed from a certain point the further route will probably have to be surveyed unless it concerns an overlap with a survey that has already been validated.

Figure 2:
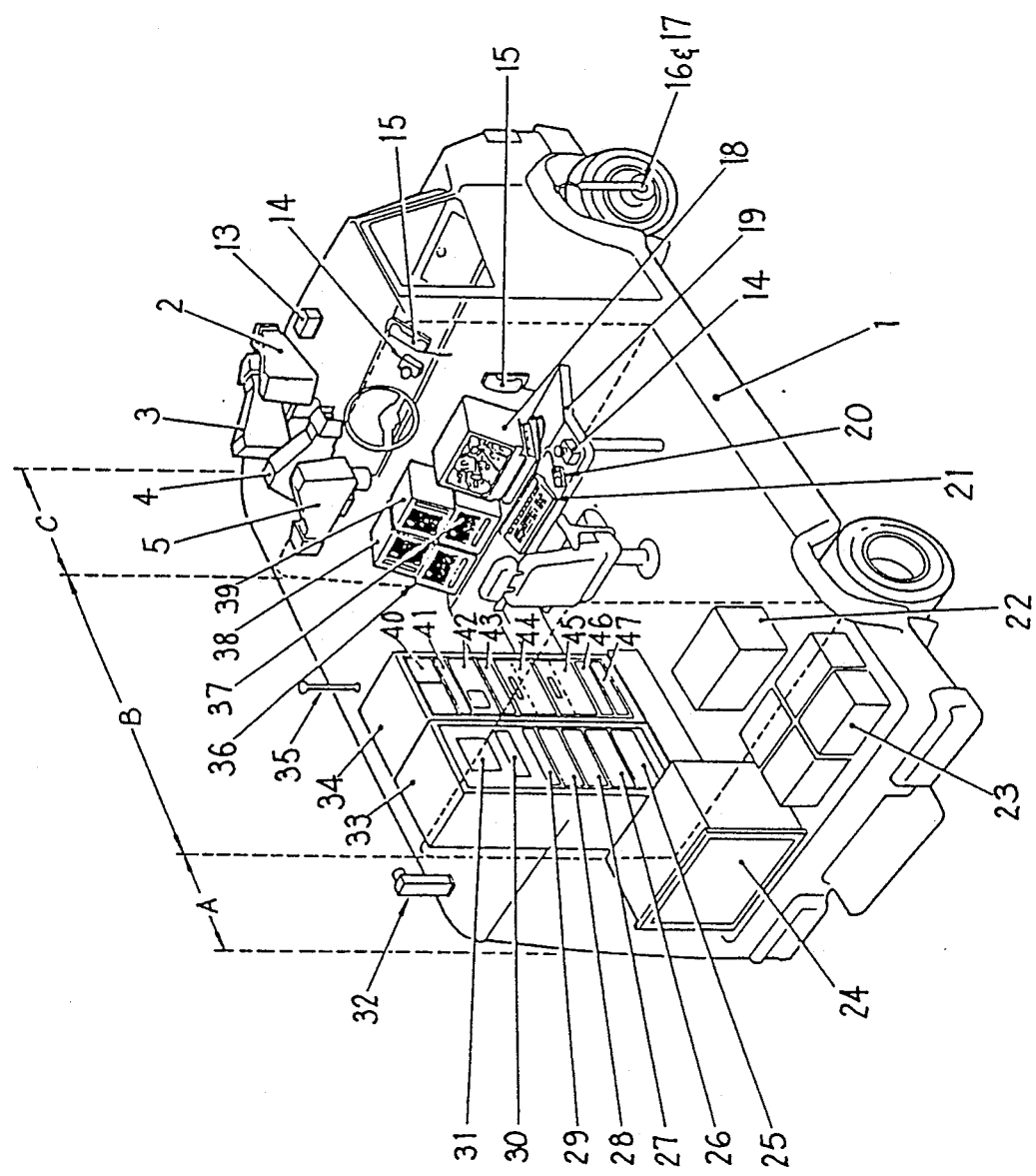
FIG. 2 is an exploded view of the recording vehicle in accordance with this invention.

In FIG. 2, reference numeral 13 designates an exposure meter (sensor), 15 a car telephone and intercom, 19 a navigator desk, 20 a mouse for onboard computer 30, 22 a voltage stabilizer, 23 several batteries, 24 a generator, 25 a height clearance interface, 26 a central data-gathering system, 31 a compass, 33 a computer cabinet, 34 a video cabinet, A a generator compartment, B a navigator compartment, C a driver's compartment, 40 a remote control video camera, 41 a multiplexer, 42 a monitor, 43 a control unit, 46 a barometric sensor, and 47 a spare rack location.

The processing

Figure 3:
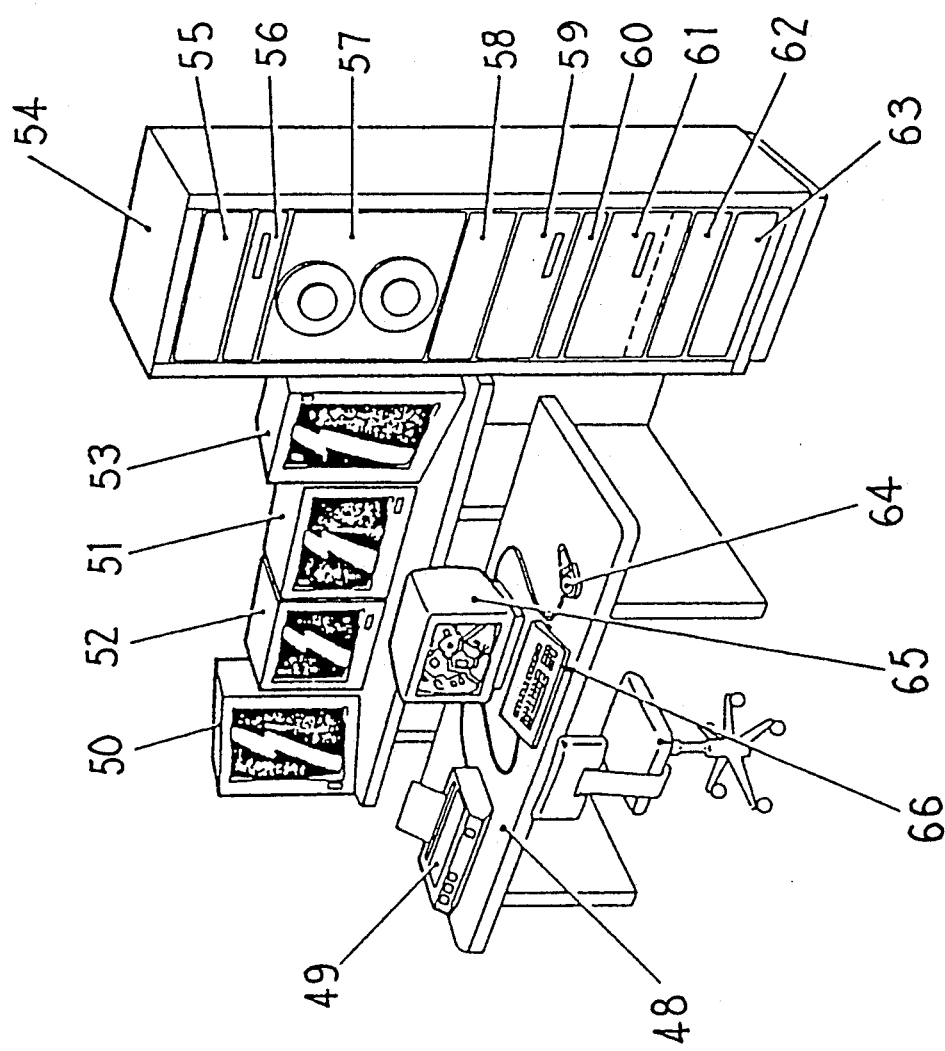
FIG. 3 is a pictorial view showing the stationary system.

After an area has been surveyed the videotapes that are made with the image data that belong to it are transported to the attribute inventory system, see FIG. 3, where the images are viewed.

Before the images are sent on, the navigator first checks if all chains are treated and he or she views the video recordings at random, during which he or she may decide to record parts again (the next day). He also checks the functioning of the equipment. At the hand of what is mentioned before the navigator makes a day-report about the particulars of the survey.

After an area has been surveyed the results are thus processed on a separate system, which hereafter will be called "attribute inventory system", as indicated in FIG. 3.

The results consist of videotapes, sensor data and a log of the way in which the survey was executed. On the attribute inventory system the videotapes are viewed, on monitors 50–53 during which road characteristics are read for the purpose of the alpha-numeric data base. Finally the data that link the recording position with image identification are stored in a file for making customertapes, via the inventory computer 55.

The floppy-discs with additional data are read-in into the attribute inventory system, via 56. The logging of the road which were driven are checked on particulars. The work-preparer views the videotapes and during this he/she reads a number of data from the video images. The operator may stop the videotape at any time and have step forward or backward one frame at a time. Using operating-commands (via special functionkeys or by using a mouse 64 and menu structure) the operator can give special features for the registration to the system.

When the videotapes are processed, the (video) tape-numbers and imagenumbers, together with the additional data are added to a central data base. This data base will further be called road-attribute data base. We will be able to read out the data with the use of the chain identification as a key. A separate data base exists in which—with the streetname as a key—we can find the chain identifications. After this the part of the central metric data base at the production company that is locked, will, possibly after updating, be released and the videotapes are kept as mastertapes.

Thus via the attribute inventory system video-mastertapes may be viewed step by step during which the system continually indicates the position on a graphic route map and shows the values that are measured, on the graphic screen 65. By way of an operating-command a project overview file may be made from which the operator has a quick overview about the fact on which tapes a specific chain was registered. The project overview file is composed by subsequently making an inventory of all image data files that occur on the system and those chains that occur in them.

During the inventory made one may ask the chain that is worked on to give a survey of the tapes on which a registration of this chain occurs.

The project overview file will have to be made only once when a new series of image data files (a new project) is added to the attribute inventory system. The old file is thus written over.

The graphic route map of a road inventory mode can be built once-only during the start of the road inventory mode and then used for the inventory of various tapes.

Each time at the start of a new tape the system verifies if the graphic presentation which is present holds good, judging from the border co-ordinates in the image data file.

Also at the start of a new tape the system verifies whether the correct mastertape is applied in the recorder by reading the first image code on the tape.

If the right tape is applied and the graphic presentation holds good then all chains on the tape are read once-only and coloured-in in a separate overlay on the screen 65. Subsequently the commands to operate the recorder 61 are released.

Internally the attribute inventory system keeps up the position of the chain in the image data file of the tape. When an operation command is given to the tape to go to the next chain, then in the image data file the image code of the next chain is read and then an order is given to the video system 61 to wind to that image code. As soon as the recorder reaches the required image code on the videotape, the recorder stops. On the graphic screen 65 the chain is then coloured as the new being performed chain and the alpha-numeric data of the chain are shown. Finally the attribute inventory system reads all the data of the chain to the internal working-memory.

When ordered to go further on the recorder, the attribute inventory system continually reads the image codes on the tape. By comparing these with the image-codes belonging to the chain registration, the attribute inventory system obtains the information about on which place on the chain the images were recorded. Each time the attribute inventory system receives an image code which belongs to the next registration distance interval, then from the distance a co-ordinate is calculated on the screen 65 and on this co-ordinate a cursor is drawn. Also the measurement values which belong to this distance are written to the screen.

When the image code, at winding through, which belongs to the end of the chain concerned, is read, then the attribute inventory system gives an order to the recorder 61 to stop the tape. The operator is asked the question if this image registration should be stored and how the quality should be judged. As soon as the answer is received, the general information on the screen 65 is worked-by.

If, at an order to wind to the next chain, it becomes clear that the next chain in the image data base is a chain for which no images are available then the position of the current chain in the image data base is adjusted, but no commands to the recorder are sent. Directly afterwards the question is asked if this chain inventory should be stored.

At the end of a tape inventory, the graphic overlay in which the special colours were applied, is wiped clear.

All road characteristics that result from viewing the mastertapes are added to an attribute storage system. The attribute storage system contains the characteristics of the entire area.

For every chain which is surveyed by a video car the following information can be added to the attributes storage system:

the measured attributes such as length, minimum height clearance, maximum inclination and barometric height. These data are registered at a distance interval of 10 meters;

the image information, indicating on which tape images of the chain can be found and which are the startand endimage on the tape, that belong to it. Various image registrations per chain may be made;

the validated attributes that are read from the images.

In FIG. 3, reference numeral 48 designates a desk inventory system, 49 a printer, 54 an inventor computer and video unit, 57 a magnetic tape unit, 58 a de-multiplexer, 66 a keyboard, and 62 and 3 spare rack locations.

The exploitation

From the mastertapes new video tapes may be made-up with images that are read from a random number of mastertapes. These tapes are called customertapes, the contents of these tapes depend on the specifications of the customer.

Figure 4:
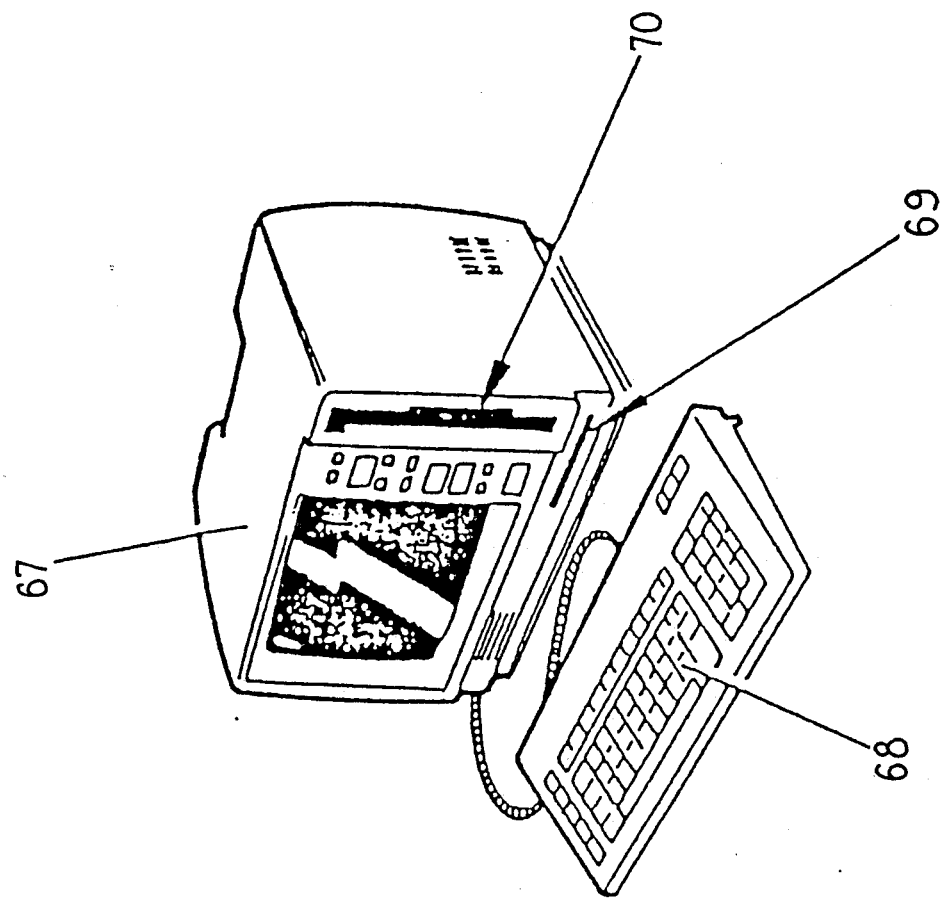
FIG. 4 is a pictorial view showing a customer set.
Figure 5:
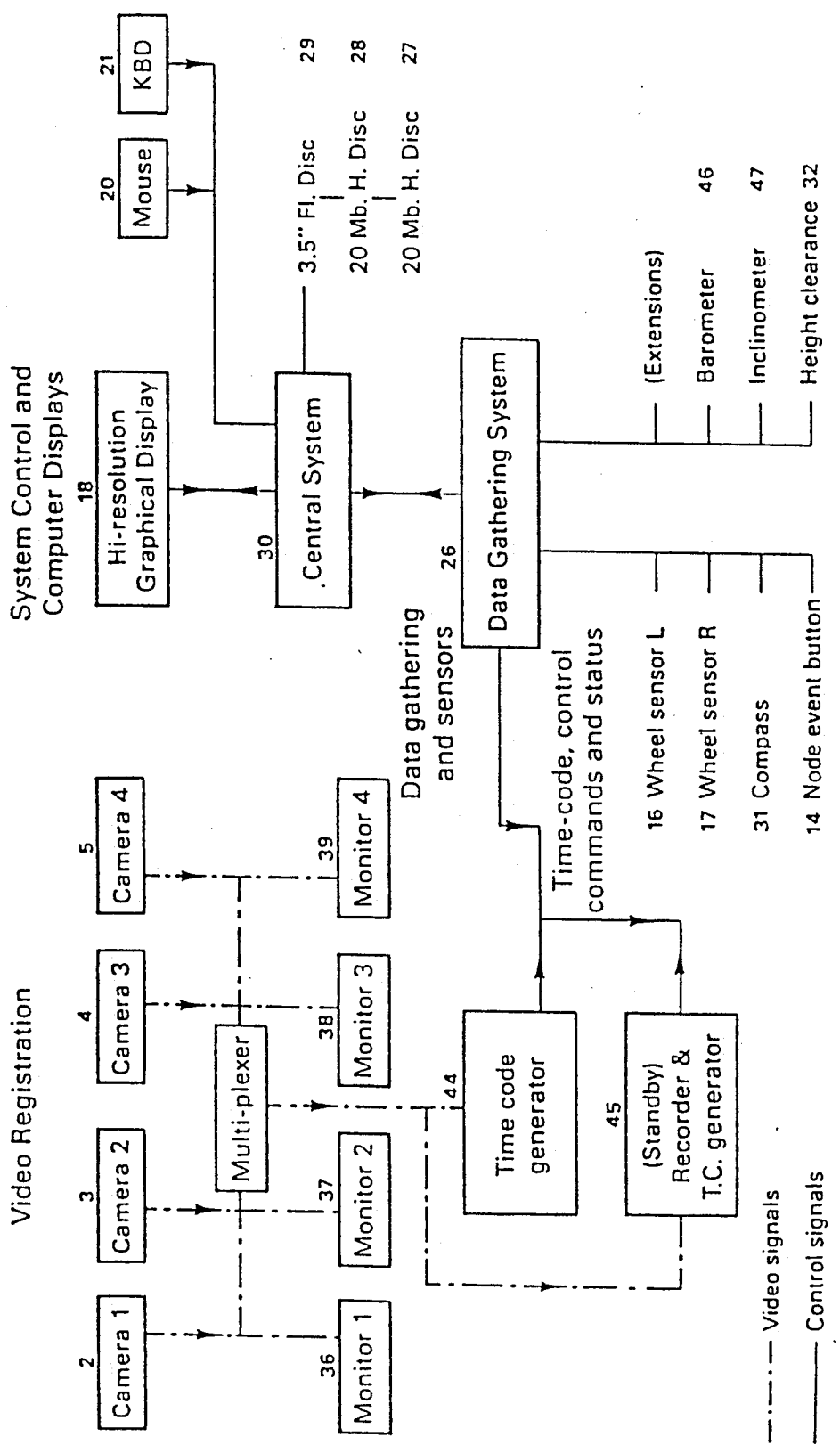
FIG. 5 is a block diagram of the mobile system.
Figure 6:
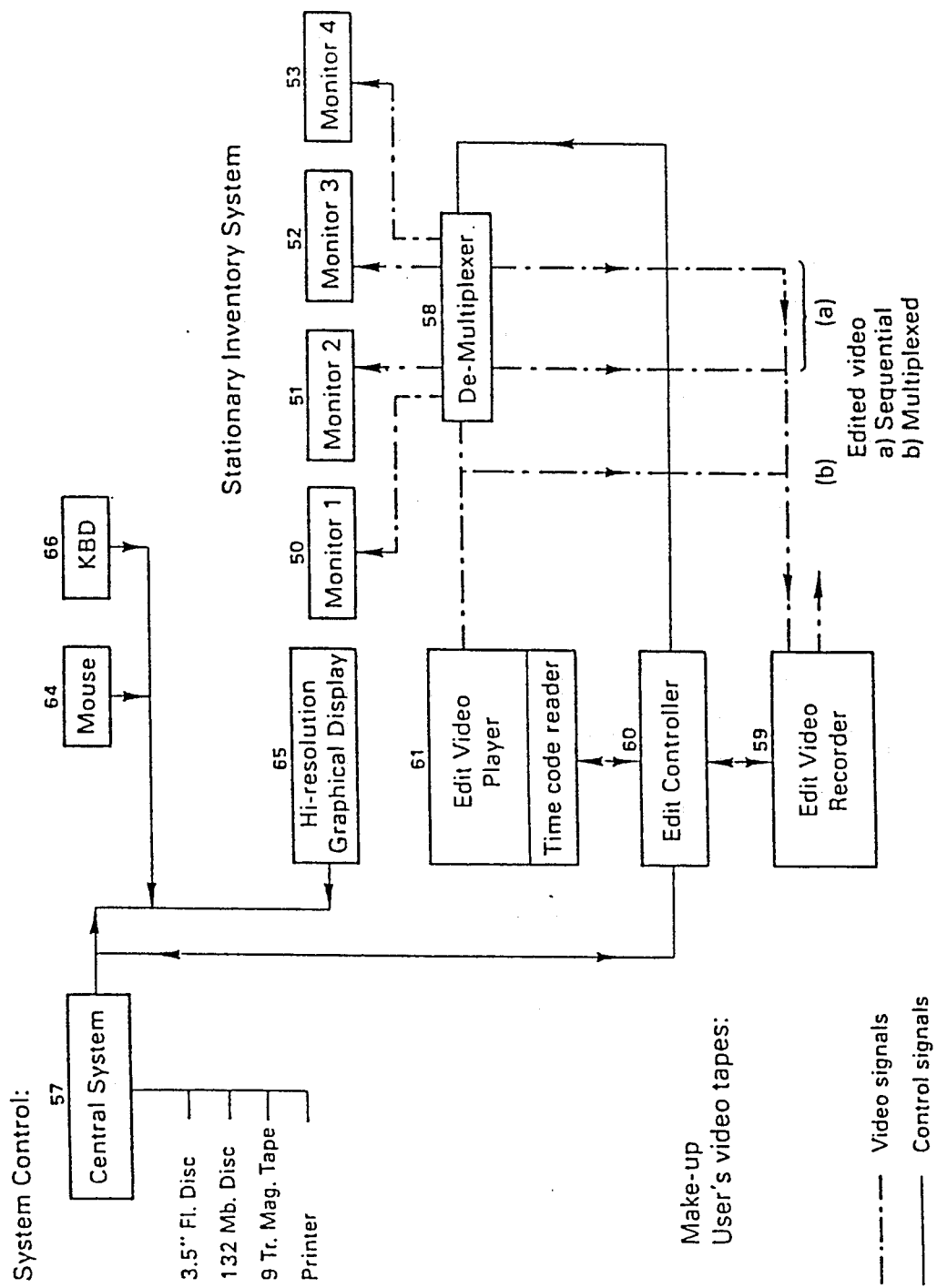
FIG. 6 is a block diagram of the stationary system.
Figure 7:
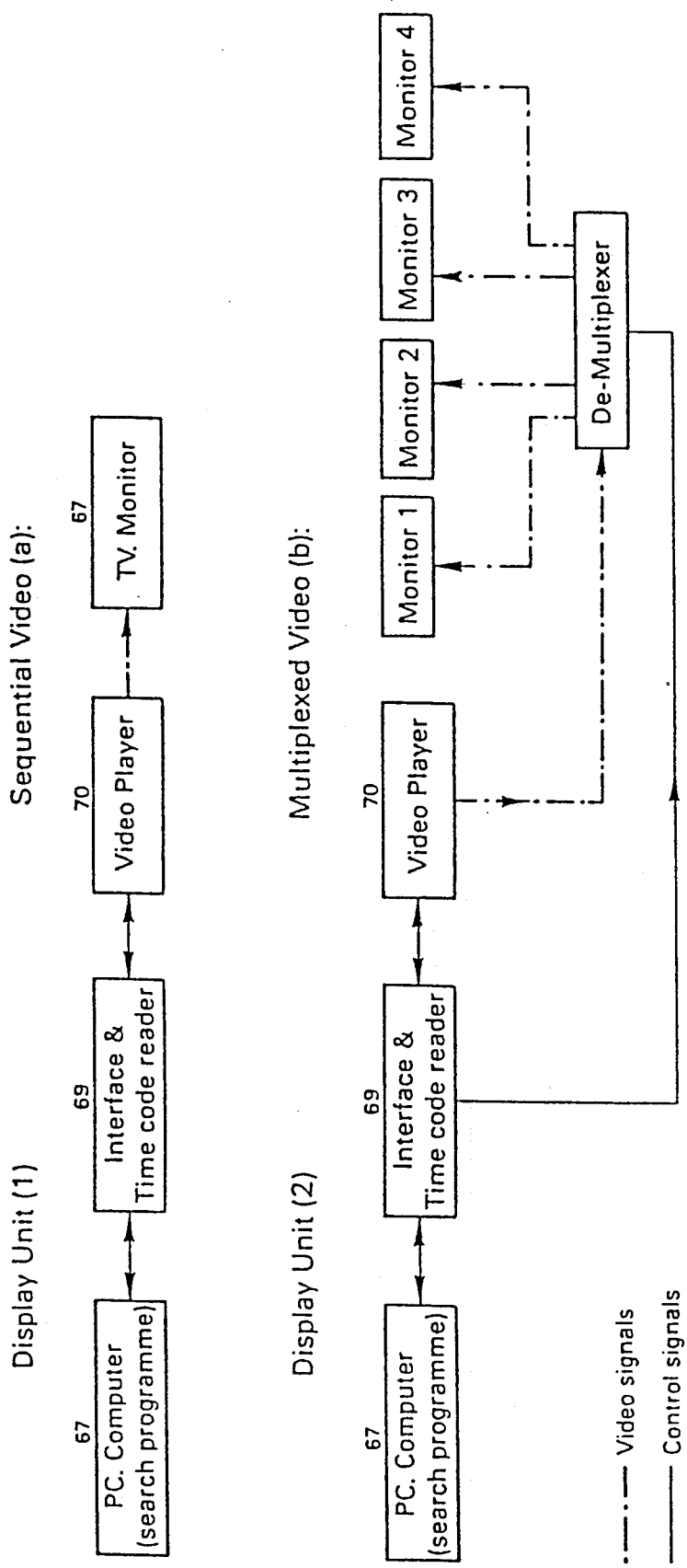
FIG. 7 is a block diagram of the possible customer sets.

A viewing-set 67 (see FIG. 4) has a keyboard 68 and is an apparatus with which images that are brought together from the image data base are made visible.

The information for a viewing-set is in principle a collection of images of the roads and streets in a certain area and added to them additional data and specialties as specified by the customer. The images are supplied on videotape (VHS or Video 8). Although there are also opportunities to supply the images in a digital shape, at the moment this does not seem a realistic proposition because of the limited capacity and the relatively high costs.

For searching purposes an index is supplied, for instance with the streetnames in alphabetical order. The index is supplied on paper or in the shape of a searching-programme in floppy-disc. With the searching-programme the tapenumber and counterposition can be found, where the images belonging to them can be found. We consider offering the following options:

the viewing-set only consists of a video recorder and the additional information is added in the image as text;

the most-extended shape consists of a "personal computer" (PC 67) with linked to it a video recorder. The index is on floppy-disc 69 and from the searching programme the videotape is automatically positioned towards the right image.

The attribute storage system contains the image information of the chains and thus is the basis for manufacturing the customertapes. This does not mean that the attribute storage system actually manufactures the customertapes, the attribute storage system only supplies the information of how the customertapes should be manufactured. The selection of the roads and streets of which images are desired will mostly be done on the basis of a combination of metric and alphanumeric criteria. For instance if a client is interested in the images of the national highways of a rough area, then first the metric chains are selected that lie in the area desired by using the central metric data base at the production company and then a further selection is executed on the basis of the chain attributes in the central alpha-numeric data base. The series of images desired are described by the image data attributes of the selected chains. The image data information together make-up a customertape manufacturing specification which exactly describes which image registrations should be written on a tape, these specifications can then be put into a tape edit system (60 with 55) which is able to actually manufacture a customertape from the specifications.

After the specifications for the customertapes have been made up on the attribute storage system, the tape edit system (60 with 55) can take care of the actual manufacturing of the customertapes. The tape edit system for this purpose has the disposal of a video-system that is able to copy images from a mastertape (in 61) to another empty tape (in 59).

Manufacturing customertapes is done per client separately. Within one command to the tape edit system all tapes can be manufactured for one client.

For every tape to-be-made the system will ask the operator to put an empty tape into the videosystem (59). For each mastertape that is then needed for this customertape, the tape edit system will ask the operator to load the mastertape concerned and subsequently the tape edit system will independently see to it that the appropriate cahin registrations are copied to the customertape. Before doing this the system will show on the operator terminal (65) how much time the copying will take and at what time the action will probably be done. When all chains which were asked for are copied from the mastertape, the tape edit system will ask the operator to remove the mastertape and to put in a next one.

This will continue until the customertape is filled. The system will then ask the operator to remove the customertape and will subsequently ask if the operator wants to contine with the next tape of the specification.

The embodiments of the invention in which an exclusive property or privilege is claimed are defined as follows:

1. A road inventory system comprising a mobile unit and a stationary unit;

wherein said mobile unit includes a vehicle used for surveying a geographic area of interest, said vehicle having:

metric data base means for delivering digital topographical information relating to the area to be surveyed;

a plurality of video cameras which are operated in a continuous manner to make video pictures of respective parts of the area to be surveyed, said cameras being connected to a video recording apparatus via a multiplexer so as to record video frames from said cameras in a given alternation on a single first recording medium, together with address signals for individually identifying each of said frames, said recording taking place under control of a time base; and a data recording apparatus connected to said data base means and to external sensing means for sensing vehicle motion parameters, including the length, direction and inclination of the route followed by said vehicle, said data recording apparatus recording, under control of said time base, on a second recording medium relevant data from said data base means together with output information of said sensing means, said apparatus producing respective address signals for identifying corresponding video frames on said first recording medium;

wherein said stationary unit includes:

video display means for reproducing, on a plurality of display screens, the video information on said first recording medium via a de-multiplexer, the latter separating the video frames recorded on said medium into individual series each corresponding to the video camera from which the frames in question originated;

data reproducing means for reproducing the data recorded on said second recording medium, and for storing said data in a data inventory system, the addresses stored therein being used for selecting the corresponding video information on said first recording medium; and data processing means for combining and recording, on a suitable third recording medium, a selection of said video and data information originating from said first and second recording media.

2. The system of claim 1, in which a first of said video cameras is directed substantially in the direction of travel of said vehicle, and a second of said video cameras is directed transversely thereto, the video frames originating from said first camera being recorded, on said first medium, in series in a regularly alternating succession, the video frames originating from said second camera being recorded on said first medium between successive said series of said first frames.

3. The system of claim 1, in which the metric data in said data base means is organised according to chains interconnecting numbered nodal points, said vehicle having signalling means, which is selectively actuated by an attendant as soon as the vehicle has reached a point on its route corresponding to a nodal point indicated by said data base means, for setting the data recording apparatus on a new chain starting point corresponding to said nodal point.

4. The system of claim 1, comprising a plurality of additional stationary units to be used by third users of the information collected by said system, each comprising display means for said third recording medium, the selection of information recorded on said third medium being selected to satisfy purposes of the user in question.

* * * * *

UNITED STATES PATENT AND TRADEMARK OFFICE
CERTIFICATE OF CORRECTION

PATENT NO.  :  4 994 971
DATED       :  February 19, 1991
INVENTOR(S) :  Theo J. POELSTRA It is certified that error appears in the above-identified patent and that said Letters Patent is hereby corrected as shown below:

Column 14, line 14; after "on" insert ---each---.

Signed and Sealed this

Third Day of November, 1992

*Attest:*

DOUGLAS B. COMER

*Attesting Officer*     *Acting Commissioner of Patents and Trademarks*